United States Patent
Lien et al.

(10) Patent No.: US 12,417,026 B2
(45) Date of Patent: *Sep. 16, 2025

(54) ADAPTIVE SENSING TIME FOR MEMORY OPERATIONS

(71) Applicant: Micron Technology, Inc., Boise, ID (US)

(72) Inventors: Yu-Chung Lien, San Jose, CA (US); Zhenming Zhou, San Jose, CA (US); Murong Lang, San Jose, CA (US); Ching-Huang Lu, Fremont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/663,978

(22) Filed: May 14, 2024

(65) Prior Publication Data

US 2024/0302967 A1    Sep. 12, 2024

Related U.S. Application Data

(63) Continuation of application No. 17/888,171, filed on Aug. 15, 2022, now Pat. No. 12,014,049.

(51) Int. Cl.
 *G06F 3/06* (2006.01)
(52) U.S. Cl.
 CPC .......... *G06F 3/0611* (2013.01); *G06F 3/0653* (2013.01); *G06F 3/0679* (2013.01)

(58) Field of Classification Search
 CPC ..... G06F 3/0611; G06F 3/0653; G06F 3/0679
 See application file for complete search history.

(56) References Cited

U.S. PATENT DOCUMENTS

| | | | |
|---|---|---|---|
| 12,014,049 B2* | 6/2024 | Lien .................. | G06F 3/0679 |
| 2020/0210259 A1* | 7/2020 | Hoei .................. | G11C 16/3418 |
| 2023/0197174 A1* | 6/2023 | Guo .................. | G11C 16/3459 |
| | | | 365/158 |

OTHER PUBLICATIONS

Non-Final Office Action, U.S. Appl. No. 17/888,171, Oct. 4, 2023, 15 pages.
Notice of Allowance, U.S. Appl. No. 17/888,171, Feb. 16, 2024, 8 pages.

* cited by examiner

*Primary Examiner* — Edward J Dudek, Jr.
(74) *Attorney, Agent, or Firm* — NICHOLSON DE VOS WEBSTER & ELLIOTT LLP

(57) ABSTRACT

Methods, systems, and apparatuses include receiving a command directed to a portion of memory. A cycle number for the portion of memory is determined. A group to which the portion of memory belongs is determined. A sensing time is determined using the cycle number and the group. The command is executed using the sensing time.

20 Claims, 6 Drawing Sheets

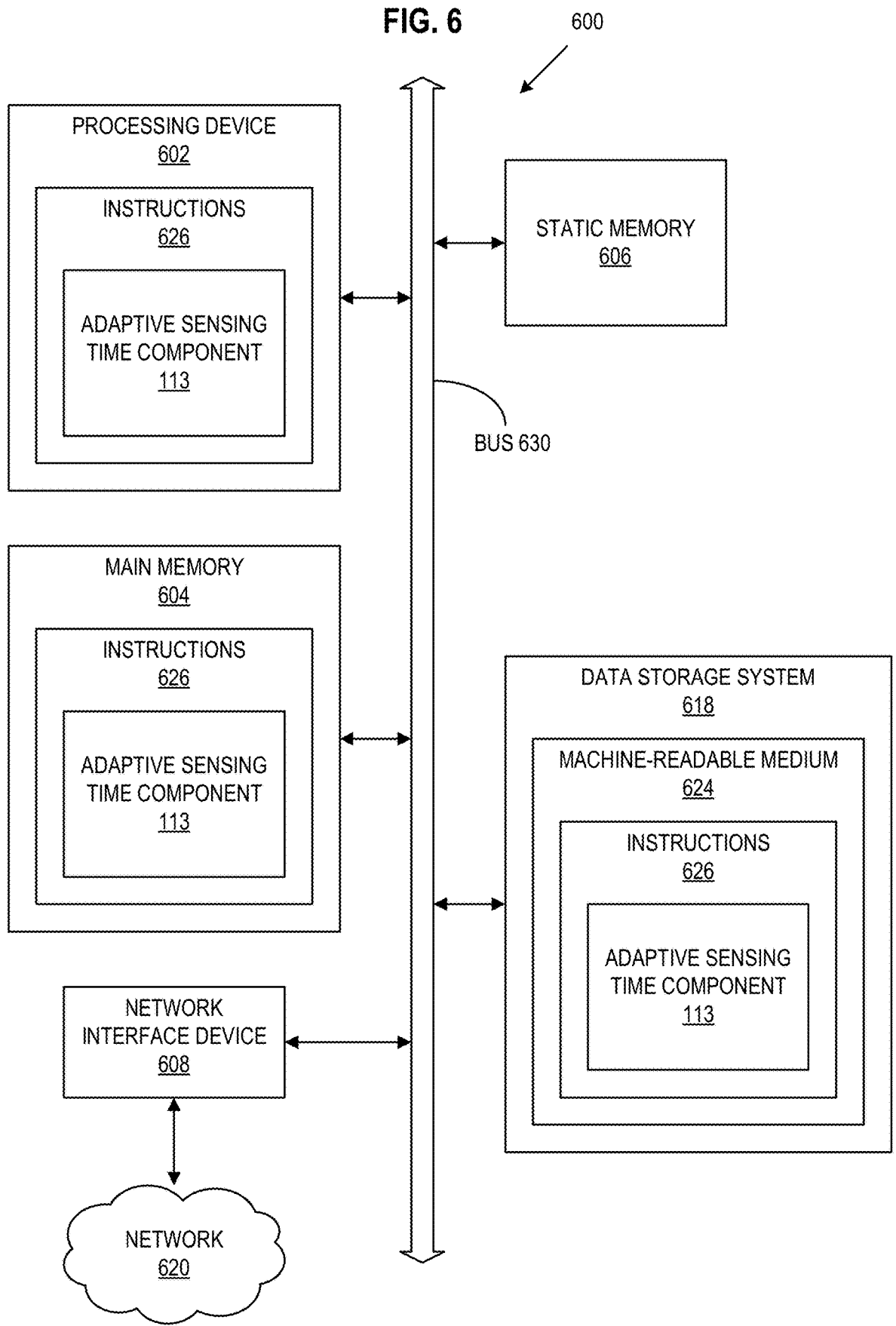

ADAPTIVE SENSING TIME FOR MEMORY OPERATIONS

CROSS-REFERENCE TO RELATED APPLICATION

The present application is a continuation of U.S. patent application Ser. No. 17/888,171 filed Aug. 15, 2022, which is hereby incorporated by reference.

TECHNICAL FIELD

The present disclosure generally relates to memory operations, and more specifically, relates to adaptive sensing time for memory operations.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 6 is a block diagram of an example computer system in which embodiments of the present disclosure may operate.

DETAILED DESCRIPTION

Figure 1:
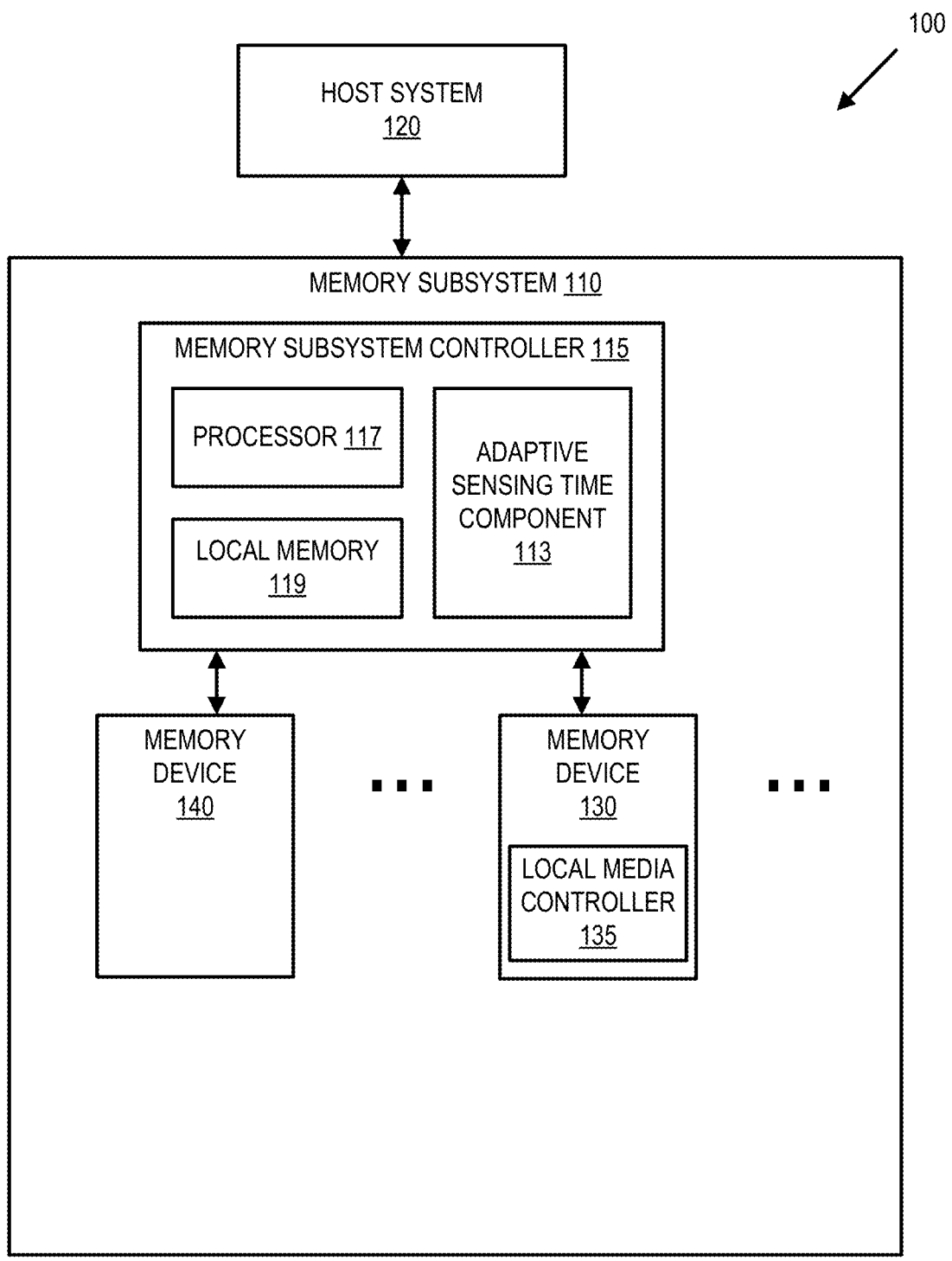
FIG. 1 illustrates an example computing system that includes a memory subsystem in accordance with some embodiments of the present disclosure.

Aspects of the present disclosure are directed to adapting sensing times in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, an SLC can store one bit of information and has two logic states.

In conventional memory systems, the integrity of the materials composing the memory device degrades over the lifetime of a memory device. This degradation leads to a reduction in read window bandwidth (RWB). For example, reducing RWB can result in inadequate differences between threshold voltage distributions for memory cell values, causing read and write operation failures. Sensing time, also known as Tsense, is an amount of time taken to sense the value of a cell for each of its states and is used in both read and write memory operations. Increasing the sensing time leads to higher reliability in the detected value of the cell. Longer sensing times, however, also result in longer operation times, such as Tread (read operation time) and Tprog (program or write operation time). As such, memory systems utilize a static sensing time and the corresponding tradeoff between reliability and operation speed.

Aspects of the present disclosure address the above and other deficiencies by adapting the sensing time for memory operations using an estimation of the degradation of a portion of memory. One estimation of the level of degradation over the lifetime of a memory device can be measured in program erase cycles (i.e., the number of times a portion of memory has been erased and rewritten). Additionally, defects introduced during manufacturing and during operation can prevent a memory device from being properly programmed or read. As such, the memory subsystem described herein dynamically selects the sensing time for memory operations using the program erase cycles, known defects, and/or variabilities for different portions of memory. The manufacturing and/or operation defects differ between portions of the memory. The different portions therefore have different starting levels of degradation as well as different speeds of degradation. Using these variabilities in defects as well as program erase cycle information to dynamically select a sensing time allows for more reliable sensing times that reduce the probability of programming and read failures while minimizing the corresponding impacts to Tread and Tprog.

Furthermore, read operation times are exposed to host devices and therefore have a larger impact on quality of service and latency than write operation times. Aspects of the present disclosure therefore further address the above and other deficiencies by adapting sensing time for memory operations using the type of memory operation. Adapting the sensing time using the type of memory operation further reduces the probability of programming and read failures while minimizing impact on quality of service and latency for operations exposed to the host device.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an adaptive sensing time component 113 that can adjust the sensing time using program erase cycles, operation type, known defects and variabilities for a portion of memory, and combinations thereof. In some embodiments, the controller 115 includes at least a portion of the adaptive sensing time component 113. For example, the controller 115 can include a processor 117 (processing device) configured to execute instructions stored in local memory 119 for performing the operations described herein. In some embodiments, an adaptive sensing time component 113 is part of the host system 120, an application, or an operating system.

The adaptive sensing time component 113 can receive a memory command directed to a portion of memory and determine a sensing time to use during execution of that memory command using program erase cycles, operation type, known defects and variabilities for a portion of memory, and combinations thereof. Further details with regards to the operations of the adaptive sensing time component 113 are described below.

Figure 2:
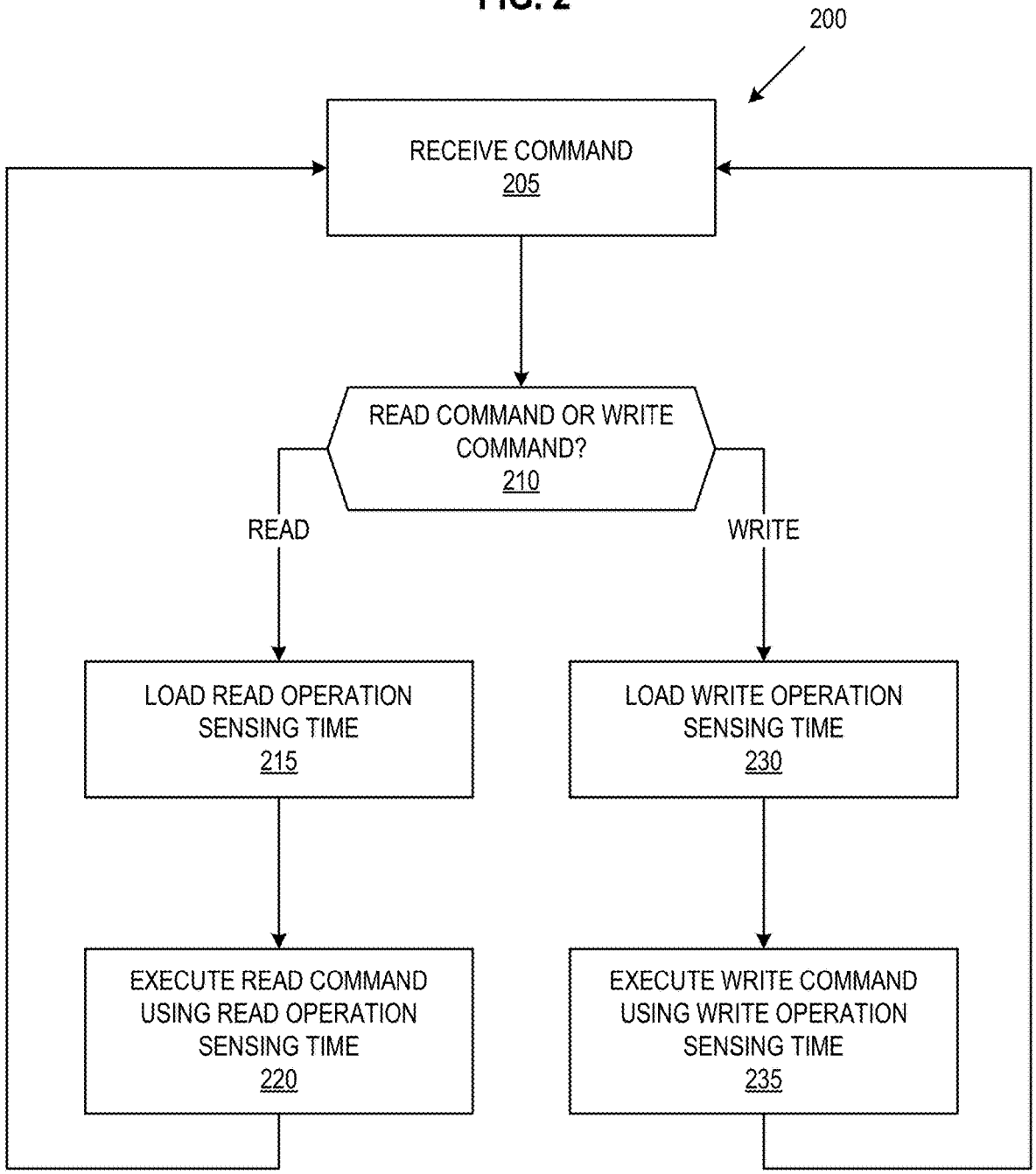
FIG. 2 is a flow diagram of an example method to adapt sensing time using operation type in accordance with some embodiments of the present disclosure.

FIG. 2 is a flow diagram of an example method 200 to adapt sensing time using operation type, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the adaptive sensing time component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device receives a command. For example, adaptive sensing time component 113 receives a memory command from a host device, such as host system 120 of FIG. 1, directed to a portion of memory, such as a portion of memory in memory device 140 of FIG. 1. The memory command includes a logical address, which when translated to a physical address, represents a portion of memory associated with the memory command.

Memory commands can also be generated within the memory subsystem. For example, data integrity scans and garbage collection can generate memory commands. The memory command can be a read command to read data from the portion of memory or a write command (also called a program command) to write data to the portion of memory.

At operation 210, the processing device determines whether the command is a read command or a write command. For example, adaptive sensing time component 113 determines whether the received command is a command to read data from the portion of memory or a command to write data to the portion of memory. If the received command is a read command, the method 200 proceeds to 215. If the received command is a write command, the method 200 proceeds to 230.

At operation 215, the processing device loads a read operation sensing time. For example, adaptive sensing time component 113 loads a sensing time to be used as a part of the read trim settings during the read operation. In one embodiment, the read operation sensing time is an amount of time threshold voltages are applied during a read operation in order for the memory subsystem to determine the value stored in one or more memory cells along a wordline. The sensing time for the read operation is shorter than a sensing time for a write operation because the time for the read operation is exposed to the host device. In other words, a host device waits for the data to be returned from the read operation but does not necessarily have to wait for the completion of a write operation. Using a shorter sensing time for read operations reduces latency and quality of service issues for the host device. In some embodiments, adaptive sensing time component 113, references a look-up table with different sensing times for different operation types and loads the sensing time for the read operation. In some embodiments, the processing device further determines the type of read operation. For example, the processing device could identify whether a read operation is a forward read operation or a reverse read operation. In such embodiments, the processing device may load a different sensing time depending on the type of read operation.

In some embodiments, rather than loading the read operation sensing time in response to receiving an operation determined to be a read operation, the processing device loads a read operation sensing time in response to an indication that a write operation has completed. For example, adaptive sensing time component 113 determines whether the program verify portion of a write command has completed. In some embodiments, the processing device loads the read operation sensing time in response to determining that a program verify portion of a write operation has completed and that a read operation is about to begin. For example, the processing device loads the read operation sensing time when a write operation has finished if the next command in a command queue is a read command. If the processing device determines that the write operation is completed or a read operation is about to begin, the processing device loads the read operation sensing time.

At operation 220, the processing device executes the read command using the read operation sensing time. For example, adaptive sensing time component 113 reads data from the portion of memory identified in the received command. Adaptive sensing time component 113 uses a read operation sensing time when sensing the values of the cells for each of the states for the portion of memory. In embodiments using different read operation types, the sensing time for the determined read operation type is used.

At operation 230, the processing device loads a write operation sensing time. For example, adaptive sensing time component 113 loads a sensing time to be used during the write operation. In one embodiment, the write operation sensing time is an amount of time threshold voltages are applied during the program verify portion of a write operation in order for the memory subsystem to determine the correct value was stored in one or more memory cells along a wordline. The sensing time for the write operation is longer than the sensing time for a read operation because the write operation is not exposed to the host device and the timing therefore does not have as much of an effect on latency and quality of service. Using a longer sensing time for the write operation allows for better accuracy without the negative impacts on latency. In some embodiments, adaptive sensing time component 113 references a look-up table with different sensing times for different operation types and loads the sensing time for the write operation to be used during the program verify portion of the write operation. For example, the sensing time is used to verify the programming between programming passes for a portion of memory programmable in multiple passes. In some embodiments, the processing device further determines the type of write operation. For example, the processing device could identify whether a write operation is a source to drain write operation or a drain to source write operation. In such embodiments, the processing device may load different sensing times depending on the type of write operation.

In some embodiments, rather than loading the write operation sensing time in response to receiving an operation determined to be a write operation, the processing device loads a write operation sensing time in response to an indication that a write operation is about to begin. For example, adaptive sensing time component 113 determines whether the buffer blocks are full and ready to copy. In some embodiments, adaptive sensing time component 113 instead determines whether the buffer satisfies a threshold of programming completion. The buffer blocks being full and ready to copy therefore indicates that a write operation is about to begin. If the buffer blocks are full and ready to copy, the processing device loads the write operation sensing time. In some embodiments, the processing device also loads the write operation sensing time in response to determining that a data integrity scan results indicate that data is to be error corrected and rewritten.

At operation 235, the processing device executes the write command using the write operation sensing time. For example, adaptive sensing time component 113 writes data to the portion of memory identified in the received command and uses the write operation sensing time during the program verify portion of the write command execution. Adaptive sensing time component 113 uses the write operation sensing time when sensing the values of the cells for each of the states for the portion of memory. In embodiments using different write operation types, the sensing time for the determined write operation type is used.

Figure 3:
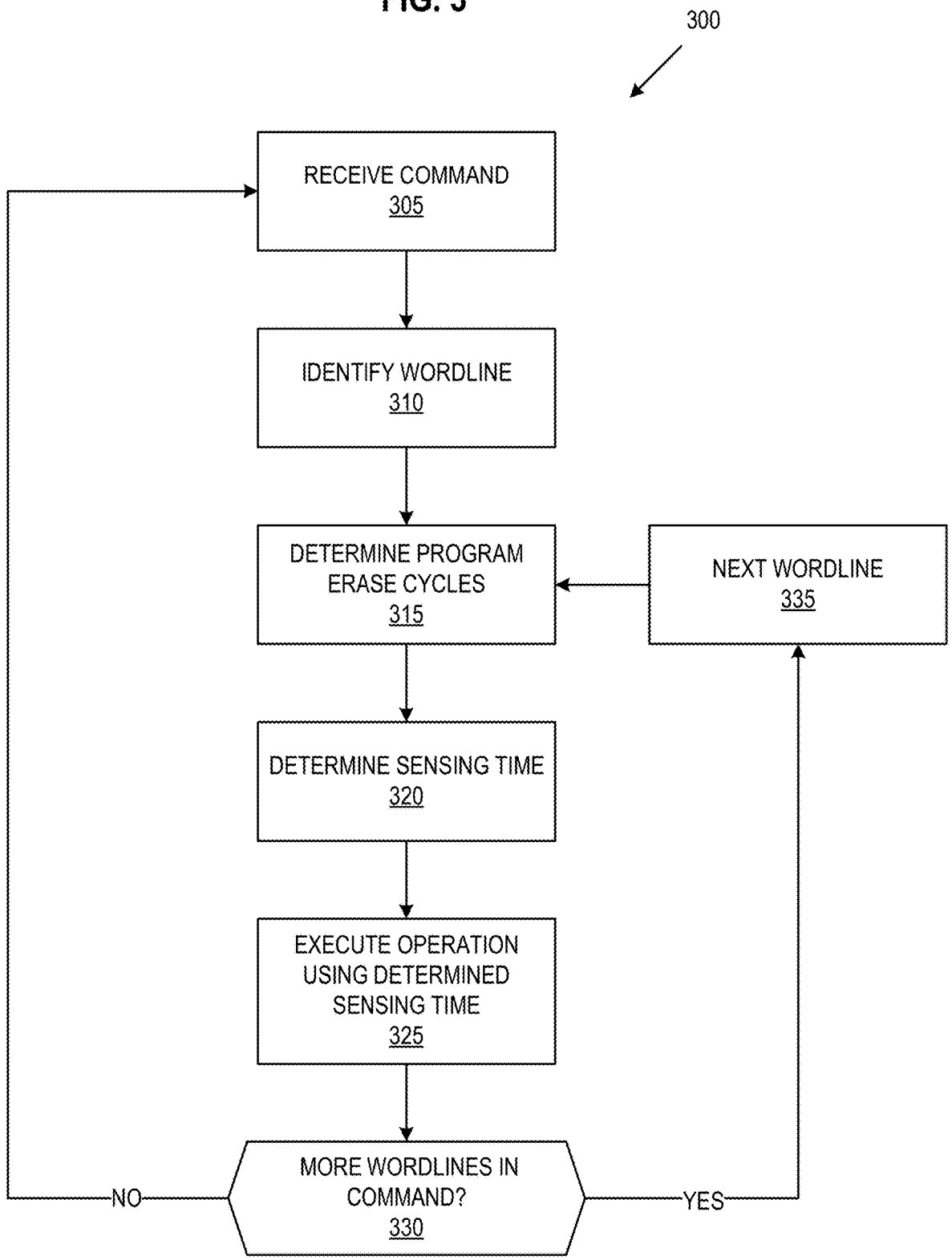
FIG. 3 is a flow diagram of an example method to adapt sensing time using program erase cycles in accordance with some embodiments of the present disclosure.

FIG. 3 is a flow diagram of an example method 300 to adapt sensing time using program erase cycles, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the adaptive sensing time component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives a command. For example, adaptive sensing time component 113 receives a memory command as described with reference to operation 205.

At operation 310, the processing device identifies a wordline associated with the command. For example, adaptive sensing time component 113 identifies the portion of memory as a wordline by translating the logical address into a physical address. In some embodiments, the processing device identifies a subdivision of memory larger or smaller than a wordline. For example, adaptive sensing time component 113 can determine the granularity for the portion of memory using the granularity of program erase cycle counters.

At operation 315, the processing device determines the program erase cycles for the identified wordline or portion of memory. For example, the processing device accesses a counter identifying program erase cycles for the portion of memory of a larger division of memory to which the portion of memory belongs. The counter identifies the number of times the portion of memory has been erased and rewritten and, therefore, estimates the wear on the portion of memory. In some embodiments, the processing device uses different metrics to determine the wear on a portion of memory such as the amount of time elapsed during continuous operation.

At operation 320, the processing device determines a sensing time using the wordline and the program erase cycles. For example, adaptive sensing time component 113 selects a sensing time using a look-up table indicating different sensing times for different combinations of wordlines and program erase cycles. Although wordlines are specifically mentioned, any granularity of memory subdivision may be used. There is generally a trade-off between storage size and accuracy of estimated wear on the portion of memory. Although small granularity sizes produce more accurate results, tracking program erase cycles for the corresponding greater number of portions of memory consumes more storage space. Wordline groups are one or more wordlines sharing similar characteristics such that they are grouped together. In some embodiments, as described with reference to FIG. 2, the sensing time is also based on the operation type.

In some embodiments, the look-up table is based on manufacturing defects and variabilities between wordline groups. For example, manufacturing defects and variabilities result in certain wordline groups having a lower starting RWB or faster degrading RWB than other wordline groups. These variabilities are determined by several factors, such as the cell sensitivity to the gate voltage. Such sensitivity is subject to manufacturing variabilities, such as the thickness of the material deposited. RWB as used throughout this disclosure includes the concept of Esum, which is a measure of reliability and the sum of the RWB for each cell state of a portion of memory. The look-up table is therefore composed of multiple sensing times for each wordline group or other subdivision of memory. Each wordline group has a sensing time for different program erase cycle subdivisions. For example, a wordline group may have a sensing time associated with 30-999 program erase cycles and another sensing time for 1000+ program erase cycles. As with the granularity for the portions of memory, the size and number of program erase cycle subdivisions depends on the system requirements and limitations. A system with little storage space or less need for accuracy may have fewer and larger program erase cycle subdivisions. A system with a high accuracy requirement or large amounts of storage space may have many and smaller program erase cycle subdivisions.

In one embodiment, higher sensing times are associated with worse RWB. Therefore, sensing times increase as program erase cycles increase and the RWB degrades. Wordline groups with worse starting RWB will also have higher sensing times. In some embodiments, wordline groups with very little degradation over time (e.g., based on a lack of manufacturing defects or variabilities) may have the same sensing time for different program erase cycle subdivisions.

In some embodiments, adaptive sensing time component 113 updates the look-up table based on estimated or actual RWB degradation. For example, adaptive sensing time component 113 updates the look-up table in response to a read disturb or other data integrity scan. Adaptive sensing time component 113 estimates RWB for each of the wordlines in the wordline groups by issuing multiple read strobes at different offsets for a given read level. Using these read strobes, adaptive sensing time component 113 determines two read strobes for which the read voltage value for the given read level satisfies an error correction threshold (e.g., a maximum bit error count). Adaptive sensing time component 113 estimates the RWB for the wordline using the read strobes (e.g., a difference in voltage between the two read strobes). Adaptive sensing time component 113 uses the estimation results and updates the look-up table to place wordlines in a wordline groups that reflect the updated RWB.

At operation 325, the processing device executes the operation using the determined sensing time. For example, for a write operation type, adaptive sensing time component 113 writes data to the portion of memory identified in the operation and uses the determined sensing time during the program verify portion of the write command execution when sensing the values of the cells for each of the states for the portion of memory. For example, the sensing time is used to verify the programming between programming passes for a portion of memory programmable in multiple passes. Conversely, for a read operation type, adaptive sensing time component 113 read data from the portion of memory identified in the operation and uses the determined sensing time when sensing the values of the cells for each of the state for the portion of memory.

At operation 330, the processing device determines whether there are more wordlines in the command. For example, adaptive sensing time component 113 determines whether all wordlines for the received command have been read or programmed (depending on the memory operation type). In some embodiments, the processing device determines whether there are more memory operations directed to the same portion of memory. If there are no more wordlines in the command, the method 300 proceeds back to operation 305. If there are remaining wordlines in the command, the method 300 proceeds to operation 335

At operation 335, the processing device proceeds to the next wordline in the command. For example, adaptive sensing time component 113 proceeds with the received command on the next portion of memory and method 300 returns to operation 315 for the subsequent wordline.

Figure 4:
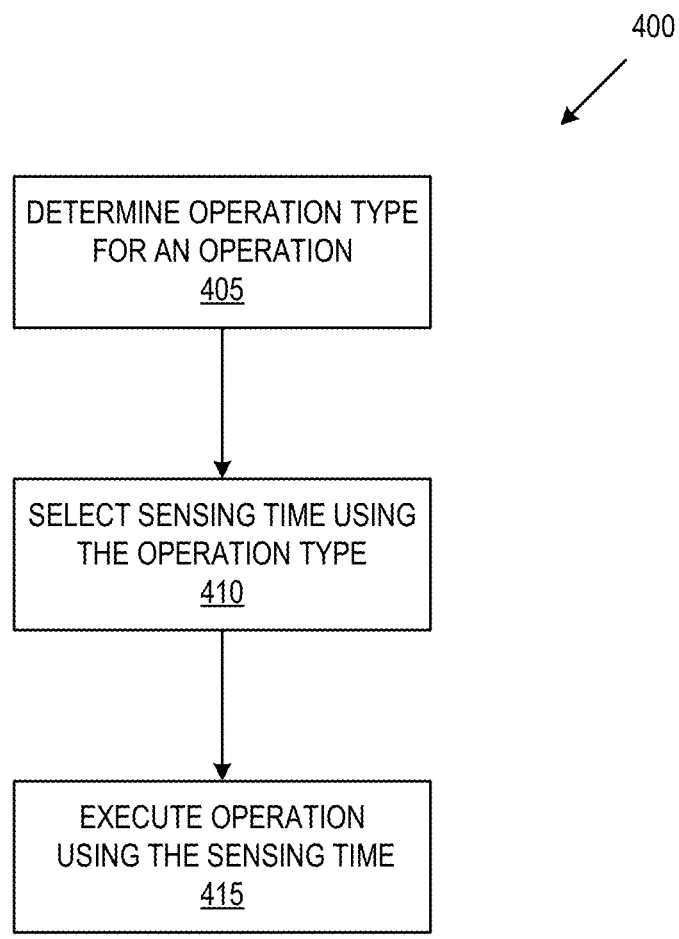
FIG. 4 is yet another flow diagram of an example method to adapt sensing time using operation type in accordance with some embodiments of the present disclosure.

FIG. 4 is a flow diagram of an example method 400 to adapt sensing time using operation type, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the adaptive sensing time component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device determines an operation type for an operation. For example, adaptive sensing time component 113 determines whether a received command is a command to read data from a portion of memory (read operation) or a command to write data to a portion of memory (write operation). The received command is a memory command from a host device, such as host system 120 of FIG. 1 and is directed to the portion of memory, such as a portion of memory in memory device 140 of FIG. 1. The memory command includes a logical address, which when translated to a physical address, represents a portion of memory associated with the memory operation. Memory commands can also be generated within the memory subsystem. For example, data integrity scans and garbage collection can generate memory commands.

In some embodiments, the processing device further determines the type of read operation or the type of write operation. For example, the processing device could identify whether a read operation is a forward read operation or a reverse read operation. In some embodiments, the processing device further determines the type of write operation. For example, the processing device could identify whether a write operation is a source to drain write operation or a drain to source write operation.

At operation 410, the processing device selects a sensing time using the operation type. For example, adaptive sensing time component 113 loads a sensing time to be used during an operation of the determined operation type. The sensing time for a read operation type is shorter than a sensing time for a write operation type since the time for the read operation is exposed to the host device. In some embodiments, adaptive sensing time component 113, references a look-up table with different sensing times for different operation types and loads the sensing time for the determined operation type. The operation type may include a read operation type, a write operation type, and subgroups within such as a forward read operation type, a reverse read operation type, a source to drain write operation type, and a drain to source write operation type.

At operation 415, the processing device executes the operation using the sensing time. For example, for a write operation type, adaptive sensing time component 113 writes data to the portion of memory identified in the operation and uses the selected sensing time during the program verify portion of the write command execution when sensing the values of the cells for each of the states for the portion of memory. Conversely, for a read operation type, adaptive sensing time component 113 reads data from the portion of memory identified in the operation and uses the selected sensing time as part of the read trim settings when sensing the values of the cells for each of the states for the portion of memory.

Figure 5:
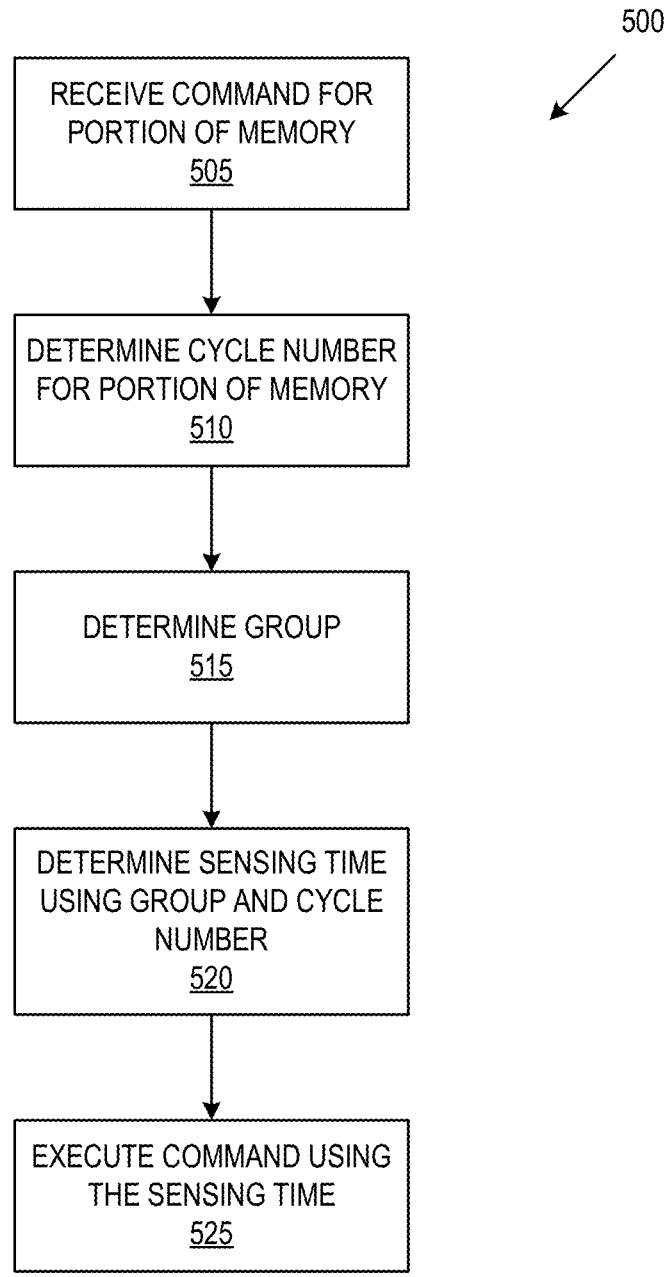
FIG. 5 is another flow diagram of an example method to adapt sensing time using program erase cycles in accordance with some embodiments of the present disclosure.

FIG. 5 is a flow diagram of an example method 500 to adapt sensing time using program erase cycles, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the adaptive sensing time component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives a command for a portion of memory. For example, adaptive sensing time component 113 receives a memory command as described with reference to operation 205.

At operation 510, the processing device determines a cycle number for the portion of memory. For example, the processing device accesses a counter identifying program erase cycles for the portion of memory of a larger division of memory to which the portion of memory belongs. The counter identifies the number of times the portion of memory has been erased and rewritten and, therefore, estimates the wear on the portion of memory. In some embodiments, the processing device uses different metrics to determine the wear on a portion of memory such as the amount of time elapsed during continuous operation.

At operation 515, the processing device determines a group to which the portion of memory belongs. For example, adaptive sensing time component 113 determines the larger division of memory to which the portion of memory belongs. In some embodiments, adaptive sensing time component 113 translates the logical address from the received command to a physical address and determines the larger division of memory using the physical address. In some embodiments, the larger division of memory is a wordline group.

At operation 520, the processing device determines a sensing time using the group and the cycle number. For example, adaptive sensing time component 113 determines a sensing time by referencing a look-up table indicating different sensing times for different combinations of wordlines and program erase cycles. In some embodiments, as described with reference to FIG. 2, the sensing time is also based on the operation type.

In one embodiment, higher sensing times are associated with worse RWB. Therefore, sensing times increase as program erase cycles increase and the RWB degrades. Wordline groups with worse starting RWB will also have higher sensing times. In some embodiments, wordline groups with very little degradation over time (e.g., based on a lack of manufacturing defects or variabilities) may have the same sensing time for different program erase cycle subdivisions.

At operation 525, the processing device executes the command using the sensing time. For example, for a write operation type, adaptive sensing time component 113 writes data to the portion of memory identified in the operation and uses the determined sensing time during the program verify portion of the write command execution when sensing the values of the cells for each of the states for the portion of memory. Conversely, for a read operation type, adaptive sensing time component 113 read data from the portion of memory identified in the operation and uses the determined sensing time when sensing the values of the cells for each of the state for the portion of memory.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the adaptive sensing time component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a adaptive sensing time component (e.g., the adaptive sensing time component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200, 300, 400, and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining a first group of a plurality of groups to which a portion of memory belongs, wherein the first group is used to determine a sensing time for the portion of memory;
   estimating a read window bandwidth for the portion of memory; and
   moving the portion of memory from the first group to a second group of the plurality of groups in response to the estimated read window bandwidth satisfying a threshold, wherein the second group is mapped to a larger sensing time than the sensing time associated with the first group.

2. The method of claim 1, further comprising:
   determining a cycle number for the portion of memory, wherein the cycle number is a number of times the portion of memory has been programmed and erased; and
   determining the sensing time of a plurality of sensing times using the cycle number and the first group.

3. The method of claim 2, wherein determining the sensing time comprises retrieving the sensing time from a lookup table that includes the plurality of sensing times wherein the sensing time is associated with the first group and the cycle number.

4. The method of claim 3, further comprising:
   determining a read disturb value for the portion of memory; and
   updating the lookup table based on the read disturb value.

5. The method of claim 3, wherein moving the portion of memory to the second group includes updating the lookup table.

6. The method of claim 1, wherein estimating the read window bandwidth for the portion of memory includes:
   receiving a command directed to the portion of memory; and
   executing the command using the sensing time corresponding to the first group.

7. The method of claim 1, wherein the portion of memory comprises a plurality of cells and wherein the sensing time is a time threshold voltages are applied to determine a value stored in a cell of the plurality of cells.

8. A non-transitory computer-readable storage medium comprising instructions that, when executed by a processing device, cause the processing device to:
   determine a first group of a plurality of groups to which a portion of memory belongs, wherein the first group is used to determine a sensing time for the portion of memory;
   estimate a read window bandwidth for the portion of memory; and
   move the portion of memory from the first group to a second group of the plurality of groups in response to the estimated read window bandwidth satisfying a threshold, wherein the second group is mapped to a larger sensing time than the sensing time associated with the first group.

9. The non-transitory computer-readable storage medium of claim 8, wherein the processing device is further to:
   determine a cycle number for the portion of memory, wherein the cycle number is a number of times the portion of memory has been programmed and erased; and
   determine the sensing time of a plurality of sensing times using the cycle number and the first group.

10. The non-transitory computer-readable storage medium of claim 9, wherein determining the sensing time comprises retrieving the sensing time from a lookup table that includes the plurality of sensing times wherein the sensing time is associated with the first group and the cycle number.

11. The non-transitory computer-readable storage medium of claim 10, wherein the processing device is further to:
    determine a read disturb value for the portion of memory; and
    update the lookup table based on the read disturb value.

12. The non-transitory computer-readable storage medium of claim 10, wherein moving the portion of memory to the second group includes updating the lookup table.

13. The non-transitory computer-readable storage medium of claim 8, wherein estimating the read window bandwidth for the portion of memory includes:
    receiving a command directed to the portion of memory; and
    executing the command using the sensing time corresponding to the first group.

14. The non-transitory computer-readable storage medium of claim 8, wherein the portion of memory comprises a plurality of cells and wherein the sensing time is a time threshold voltages are applied to determine a value stored in a cell of the plurality of cells.

15. A system comprising:
    a plurality of memory devices; and
    a processing device, operatively coupled with the plurality of memory devices, to:
    receive a command directed to a portion of memory; and
    determine a first group of a plurality of groups to which the portion of memory belongs, wherein the first group is used to determine a sensing time for the portion of memory;
    execute the command using the sensing time corresponding to the first group;
    estimate a read window bandwidth for the portion of memory; and
    move the portion of memory from the first group to a second group of the plurality of groups in response to the estimated read window bandwidth satisfying a threshold, wherein the second group is mapped to a larger sensing time than the sensing time associated with the first group.

16. The system of claim 15, wherein the processing device is further to:
    determine a cycle number for the portion of memory, wherein the cycle number is a number of times the portion of memory has been programmed and erased; and
    determine the sensing time of a plurality of sensing times using the cycle number and the first group.

17. The system of claim 16, wherein determining the sensing time comprises retrieving the sensing time from a lookup table that includes the plurality of sensing times wherein the sensing time is associated with the first group and the cycle number.

18. The system of claim 17, wherein the processing device is further to:
    determine a read disturb value for the portion of memory; and
    update the lookup table based on the read disturb value.

19. The system of claim 17, wherein moving the portion of memory to the second group includes updating the lookup table.

20. The system of claim 15, wherein the portion of memory comprises a plurality of cells and wherein the sensing time is a time threshold voltages are applied to determine a value stored in a cell of the plurality of cells.

* * * * *